US 7,720,171 B2

(12) United States Patent
Honcharenko et al.

(10) Patent No.: US 7,720,171 B2
(45) Date of Patent: May 18, 2010

(54) COEFFICIENT ESTIMATION METHOD AND APPARATUS

(75) Inventors: Walter Honcharenko, Monmouth Junction, NJ (US); Kyriaki Konstantinou, Madison, NJ (US)

(73) Assignee: Alcatel-Lucent USA Inc., Murray Hill, NJ (US)

( * ) Notice: Subject to any disclaimer, the term of this patent is extended or adjusted under 35 U.S.C. 154(b) by 1966 days.

(21) Appl. No.: 10/460,380

(22) Filed: Jun. 13, 2003

(65) Prior Publication Data

US 2004/0252784 A1 Dec. 16, 2004

(51) Int. Cl.
H04L 27/00 (2006.01)
(52) U.S. Cl. .................................. 375/295; 375/285
(58) Field of Classification Search ......... 375/295–297, 375/285, 278; 330/149
See application file for complete search history.

(56) References Cited

U.S. PATENT DOCUMENTS

| 5,507,014 | A | * | 4/1996 | Wray et al. ............... 455/114.3 |
| 5,559,807 | A | | 9/1996 | Van Den Heuvel et al. |
| 5,722,056 | A | | 2/1998 | Horowitz et al. |
| 5,748,678 | A | * | 5/1998 | Valentine et al. ............. 375/297 |
| 5,867,065 | A | * | 2/1999 | Leyendecker ............... 330/149 |
| 5,870,668 | A | | 2/1999 | Takano et al. |
| 5,892,397 | A | * | 4/1999 | Belcher et al. .............. 330/149 |
| 6,054,894 | A | * | 4/2000 | Wright et al. ............... 330/149 |
| 6,054,896 | A | * | 4/2000 | Wright et al. ............... 330/149 |
| 6,141,390 | A | * | 10/2000 | Cova .......................... 375/297 |
| 6,246,286 | B1 | * | 6/2001 | Persson ...................... 330/149 |
| 6,272,336 | B1 | * | 8/2001 | Appel et al. ................ 455/423 |
| 6,496,062 | B1 | * | 12/2002 | Nitz et al. ..................... 330/52 |
| 6,545,535 | B2 | * | 4/2003 | Andre ......................... 330/149 |
| 6,577,192 | B2 | * | 6/2003 | Maniwa et al. ............. 330/149 |
| 6,587,514 | B1 | * | 7/2003 | Wright et al. ............... 375/296 |
| 6,600,792 | B2 | * | 7/2003 | Antonio et al. ............. 375/297 |
| 6,642,786 | B1 | * | 11/2003 | Jin et al. ..................... 330/149 |
| 6,751,447 | B1 | * | 6/2004 | Jin et al. ................... 455/114.3 |
| 6,973,139 | B2 | * | 12/2005 | Ahn et al. ................... 375/297 |
| 6,985,033 | B1 | * | 1/2006 | Shirali et al. ............... 330/149 |
| 7,058,369 | B1 | * | 6/2006 | Wright et al. ............ 455/114.2 |
| 7,085,330 | B1 | * | 8/2006 | Shirali ........................ 375/296 |
| 2002/0027961 | A1 | * | 3/2002 | Rexberg et al. ............ 375/297 |
| 2003/0058959 | A1 | * | 3/2003 | Rafie et al. ................. 375/296 |
| 2003/0058960 | A1 | * | 3/2003 | Lee ............................. 375/297 |
| 2003/0179831 | A1 | * | 9/2003 | Gupta et al. ................ 375/296 |
| 2003/0202615 | A1 | * | 10/2003 | Bach et al. ................. 375/296 |
| 2003/0231716 | A1 | * | 12/2003 | Unger ......................... 375/296 |
| 2004/0142667 | A1 | * | 7/2004 | Lochhead et al. ......... 455/114.3 |

OTHER PUBLICATIONS

European Search Report dated Oct. 28, 2004.

* cited by examiner

*Primary Examiner*—Emmanuel Bayard
(74) *Attorney, Agent, or Firm*—Harness, Dickey & Pierce, P.L.C.

(57) ABSTRACT

At least one training signal burst is applied to an electronic circuit including an amplifier to train a predistortion circuit associated with the amplifier.

9 Claims, 4 Drawing Sheets

COEFFICIENT ESTIMATION METHOD AND APPARATUS

BACKGROUND OF THE INVENTION

The present invention generally relates to coefficient estimation methods, in particular, coefficient estimation methods used in conjunction with digitally predistorted transmitters and/or amplifiers.

Current wideband code division multiple access (W-CDMA) third generation (3G) systems will likely form an infrastructure for mobile speech, video, and high-speed data communications. The number of broadband Internet services is rapidly increasing in fixed networks, and people accustomed to having a broadband environment in their home are now beginning to expect a similarly broadband mobile environment. As a result, the 3G systems are evolving to accommodate more subscribers and provide broadband mobile data communications.

Networks and base transceiver stations (BTSs) for third generation systems have been deployed; however, these BTSs do not have the capabilities needed to provide full 3G mobile services. The next phase of equipment should support greater capacities and faster data services such as high-speed downlink packet access (HSDPA) for W-CDMA and CDMA2000 systems. However, total power consumption of high-capacity BTSs tends to be higher than that of current lower capacity BTSs, because the high-capacity BTSs use more radio frequency (RF) carriers and have more baseband signal processing units. This increased power consumption makes it difficult to implement the high-capacity BTSs using the current BTS infrastructure. In particular, the heat produced by the power amplifiers implemented in high-capacity BTSs overwhelms the heat removal capacity of the current BTS infrastructure. Increasing the linearity of the power amplifier used in high-capacity BTSs may allow their use in the current BTS infrastructure.

Ideally, an amplifier provides uniform gain throughout a dynamic range thereof so that the output signal of the amplifier is a correct, amplified version of an input signal. However, in reality, amplifiers exhibit non-ideal properties such as non-linear amplitude and phase distortion, which are undesirable and may deteriorate performance of a system employing the amplifier.

One effect of this is the generation of output frequencies equal to sums and differences of integer multiples of input frequency components. This effect is known as intermodulation distortion (IMD) and is particularly undesirable in high-power radio frequency (RF) amplifiers designed for use in multicarrier or multichannel systems. For example, a broadband amplifier used in a wireless system may generate various undesirable intermodulation products as a result of amplifying a multitude of channels occurring at fixed frequency intervals across a band.

In order to compensate for the non-linearity of an amplifier, the amplifier may be operated in a linear zone. That is, the lower the power level of the amplifier, the smaller the non-linearity manifested by the amplifier. This technique may limit the acceptable operating range of the amplifier, since the amplifier must be operated below maximum power output to avoid undesirable non-linearity.

Another possible linearization method includes using a testing stage applied to an amplifier prior to a field implementation thereof. During the prior testing stage, a test signal may be slowly amplified, corresponding output signals may be sampled over a period, and the input signals may be compared with the sampled output signals so as to determine distortion parameters specific to the amplifier at the time the sampling was performed. These distortion parameters, also known as coefficients, may be used to modify an input signal of the amplifier such that an output therefrom is as linear as possible. This technique for compensating for the non-linearity of an amplifier requires a significant period of time to complete. Moreover, the determined distortion parameters may not be optimum for various amplifier input signals.

SUMMARY OF THE INVENTION

In an exemplary embodiment of the present invention, at least one signal burst is applied to a transmitter including an amplifier to train or adjust a predistortion circuit associated with the amplifier. Predistortion coefficients generated as a result of the training may be used by the transmitter to predistort call traffic processed thereby.

In one exemplary embodiment of the present invention, a unit applies at least one training signal burst to a transmitter including an amplifier to train or adjust a predistortion circuit associated with the amplifier. Similar to the first embodiment, predistortion coefficients generated as a result of the training may be used by the transmitter to predistort call traffic in a wireless communications system.

In another exemplary embodiment of the present invention, a first training signal burst is applied, a first set of coefficients based upon the first training signal burst is calculated, a second training signal burst is applied, the second training signal burst is predistorted using the first set of coefficients, and a second set of coefficients is calculated based upon the predistorted second training signal burst.

BRIEF DESCRIPTION OF THE DRAWINGS

Exemplary embodiments of the present invention will become more fully understood from the detailed description given hereinbelow and the accompanying drawings, wherein like elements are represented by like reference numerals, which are given by way of illustration only and thus are not limitative of the exemplary embodiments of the present invention and wherein.

DETAILED DESCRIPTION OF EXEMPLARY EMBODIMENTS

The exemplary embodiments of the present invention described herein are merely illustrative of the present invention. Therefore, the exemplary embodiments should not be considered as limiting of the present invention.

First, a transmitter according to an exemplary embodiment of the present invention will be described. Second a pulse generation unit according to an exemplary embodiment of the present invention will be described. Third, a coefficient estimation method according to an exemplary embodiment of the present invention will be described. Finally, alternative exemplary embodiments of the present invention will be described.

Transmitter Embodiment

Figure 1:
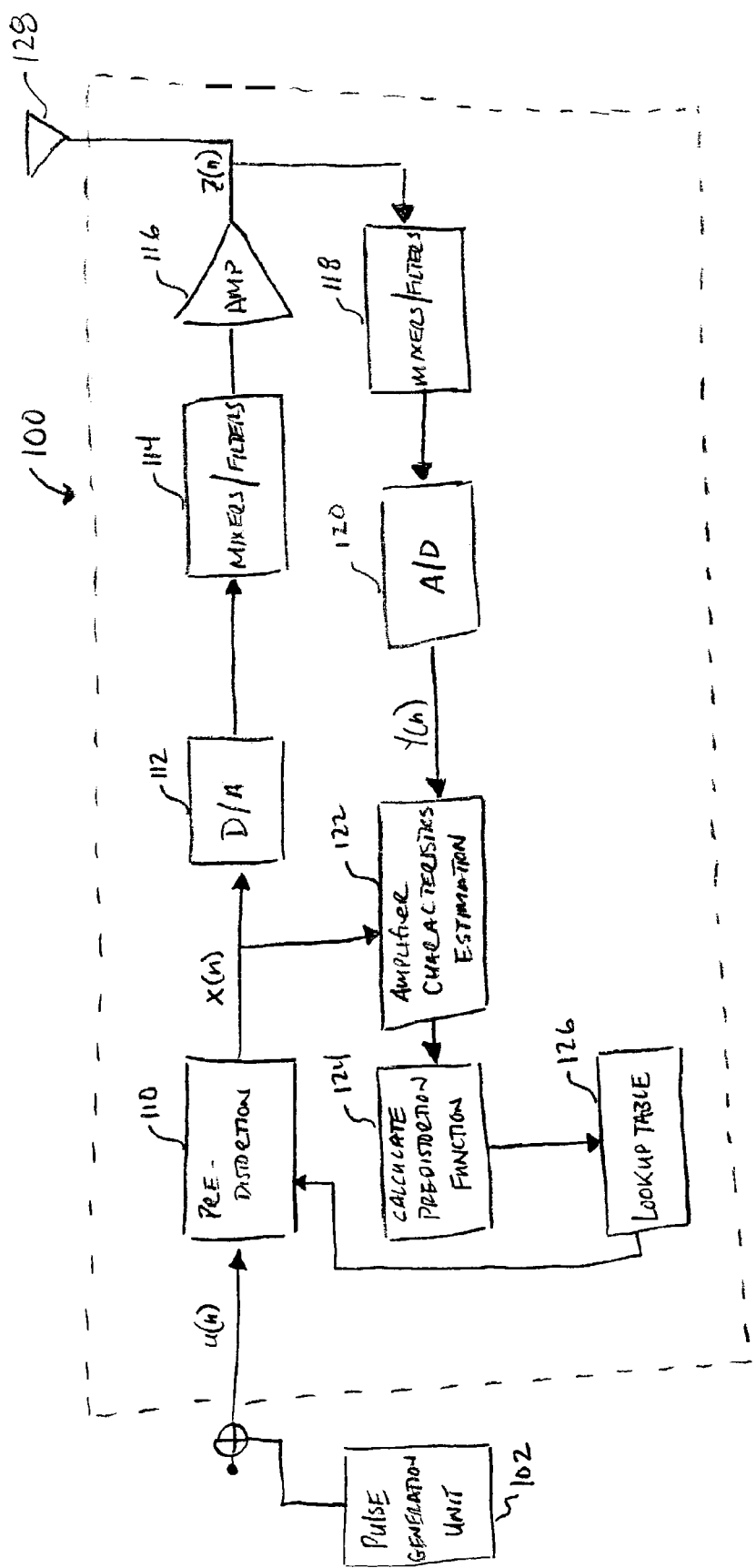
FIG. 1 illustrates a transmitter having a pulse generation unit interfaced thereto for implementing a method in accordance with an exemplary embodiment of the present invention.

FIG. 1 illustrates a transmitter 100 having a pulse generation unit 102 interfaced (described later) thereto for implementing a coefficient estimation method in accordance with an exemplary embodiment of the present invention. The transmitter 100 may be implemented in various devices that transmit signals. For example, the transmitter 100 may be used in a base transceiver station (BTS), a transceiver, etc.

The transmitter 100 includes a predistortion unit 110, a digital to analog converter 112, a first mixers and filters unit 114, an amplifier 116, a second mixers and filters unit 118, an analog to digital converter 120, an amplifier characteristics estimation unit 122, a calculate predistortion function unit 124 and a lookup table unit 126. A source signal u(n) is input to the transmitter 100 and processed by the predistortion unit 110. The source signal u(n) may or may not undergo predistortion by the predistortion unit 110. That is, the predistortion unit 110 may pass the source signal u(n) unchanged to the amplifier 116 for amplification and output by the transmitter 100. However, the predistortion unit 110 may also predistort the source signal u(n) in the predistortion unit 110.

Generally, if a predistortion function has already been estimated, the source signal u(n) will undergo predistortion by the predistortion unit 110. The predistortion unit 110 outputs a signal x(n), which is converted to an analog signal by the digital to analog converter 112. Next, the converted signal is up-converted to radio frequency (RF) by the first mixers and filters unit 114. The RF signal is received by the amplifier 116, amplified, output as an output signal z(n) and transmitted by an antenna 128.

The output signal z(n) from the amplifier 116, may also be sampled and fed back to the amplifier characteristics estimation unit 122. In such a case, the signal output by the amplifier 116 is processed by the second mixers and filters unit 118. The second mixers and filters unit 118 down-converts the output signal z(n) to a signal in the intermediate frequency (IF) range. The IF signal is converted by the analog to digital converter 120 to a signal y(n) that can be processed by the amplifier characteristics unit 122.

The amplifier characteristics estimation unit 122, which uses a known process, compares the signal x(n) output from the predistortion unit 110 with the analog signal y(n) received from the analog to digital converter 120. The output of the amplifier characteristics estimation unit 122 is a complex polynomial equation that models the baseband behavior of the amplifier 116.

The complex polynomial output by the unit 122 is used by the calculate predistortion function unit 124 in a known manner to provide an approximate function providing a coefficient vector that makes the relationship between signals u(n) and z(n) as linear as possible. Ideally, the approximate function would be an inverse function of the complex polynomial equation output from the amplifier characteristics estimation unit 122.

Coefficients of the coefficient vector may be stored in the form of a lookup table in the lookup table unit 126. The use of the lookup table unit 126 saves calculation load that would be required if coefficients had to be calculated on the fly. In the absence of the lookup table unit 126, the calculate predistortion unit 124 may be interfaced directly with the predistortion unit 110, so that calculated coefficients can pass directly from the calculate predistortion function unit 124 to the predistortion unit 110. Nonetheless, the predistortion unit 110 uses the coefficients to predistort the input signal u(n) with the goal of providing the output signal z(n) with near linear relationship to the input signal u(n).

Pulse Generation Unit

As was mentioned heretofore, FIG. 1 illustrates a pulse generator 102 that is interfaced the transmitter 100. The pulse generator 102 is capable of generating pulses of white Gaussian noise, uniform white noise, Poisson noise, or the like, that may be received and processed by the transmitter 100. These pulses generally have a particular power level, and in particular, the pulses generally have a power level capable of exciting or nearly exciting a full dynamic range of the amplifier 116.

In one embodiment of the present invention, the pulse generator 102 is used to train the transmitter 100 before actual traffic signals are processed thereby. In particular, before the transmitter 100 is put into service, the coefficients used by the predistortion unit 110 and stored in the lookup table 126 should be developed. The pulses generated by the pulse generator 102 are used by the amplifier characteristics estimation unit 122 and the calculate predistortion function unit 124 for this purpose.

For example, at least one or more pulses generated by the pulse generator 102 may be applied to the transmitter 100 with the sole purpose of exciting the amplifier 116 to an upper level of its full dynamic range. This is desirable, since the amplifier 116 may not reach the upper level of its full dynamic range during normal operation, where traffic signals are being processed. These pulses are also processed by the amplifier characteristics estimation unit 122 and the calculate predistortion function unit 124 in a known manner to develop a set of predistortion coefficients that may be stored in the lookup table unit 126 and used by the predistortion unit 110 to predistort regular traffic signals processed by the transmitter 100.

In an alternative embodiment of the present invention, the pulse generation unit 102 generates at least one pulse that is added to a traffic signal in order to excite or nearly excite the full dynamic range of the amplifier 116. For example, the pulse generation unit 102 may generate two pulses that are used to train the transmitter 100 before actual traffic signals are processed by the transmitter 100, and subsequently, an additional pulse may be generated by the pulse generation unit 102 that is added to a traffic signal as it is processed by the transmitter 100. Thus, coefficients are first generated in the absence of traffic signals, and then coefficients are generated while a traffic signal is being processed. It should be noted that, the pulse generation unit 102 should take into consideration the current power level of the traffic signal in adding the pulse to a traffic signal. That is, the added pulse should be inversely proportional to the current power level of the traffic signal it is applied to.

Figure 2:
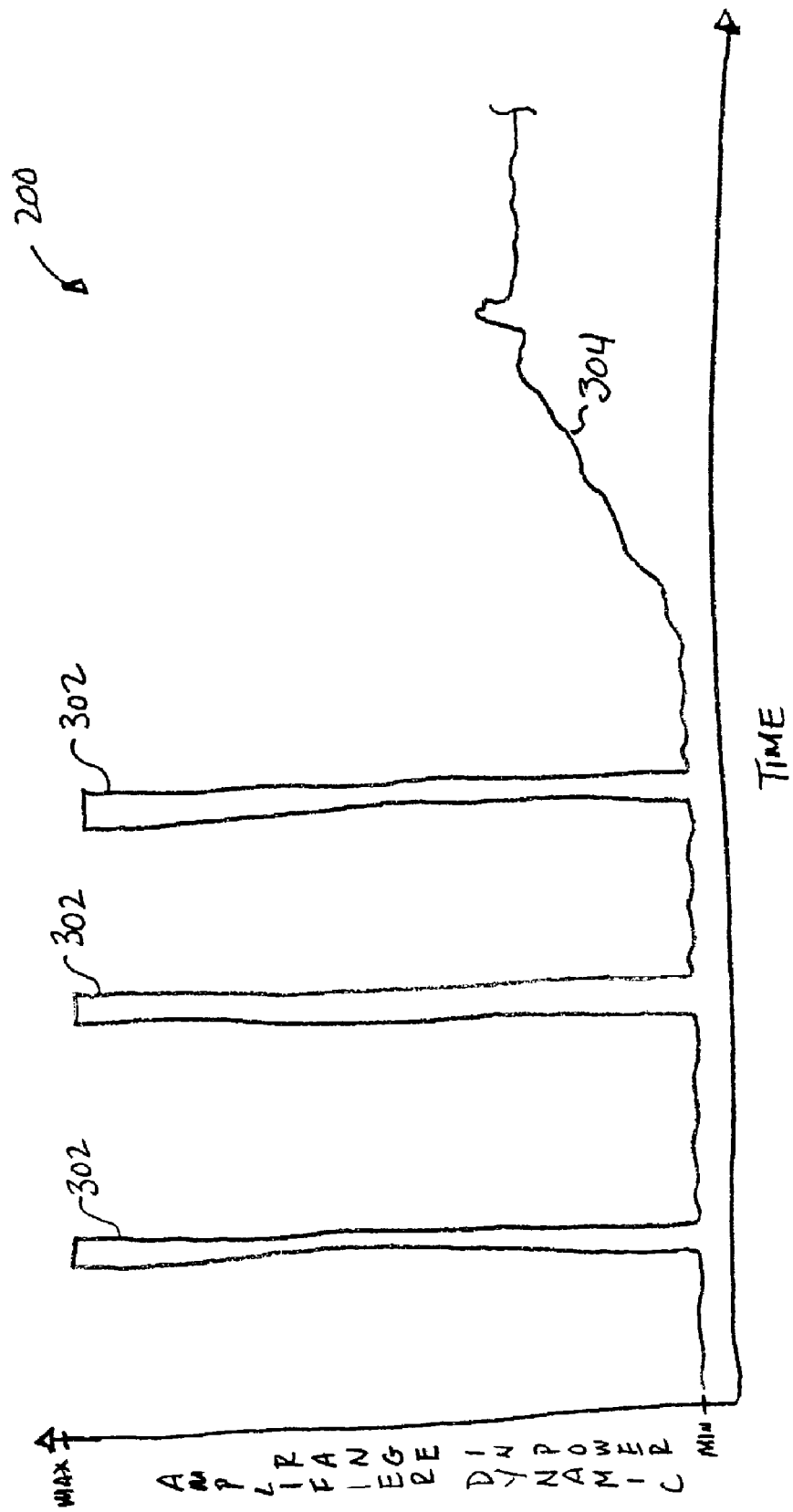
FIG. 2 is a graph illustrating a plurality of pulses used to train a transmitter in accordance with an exemplary embodiment of the present invention.
Figure 3:
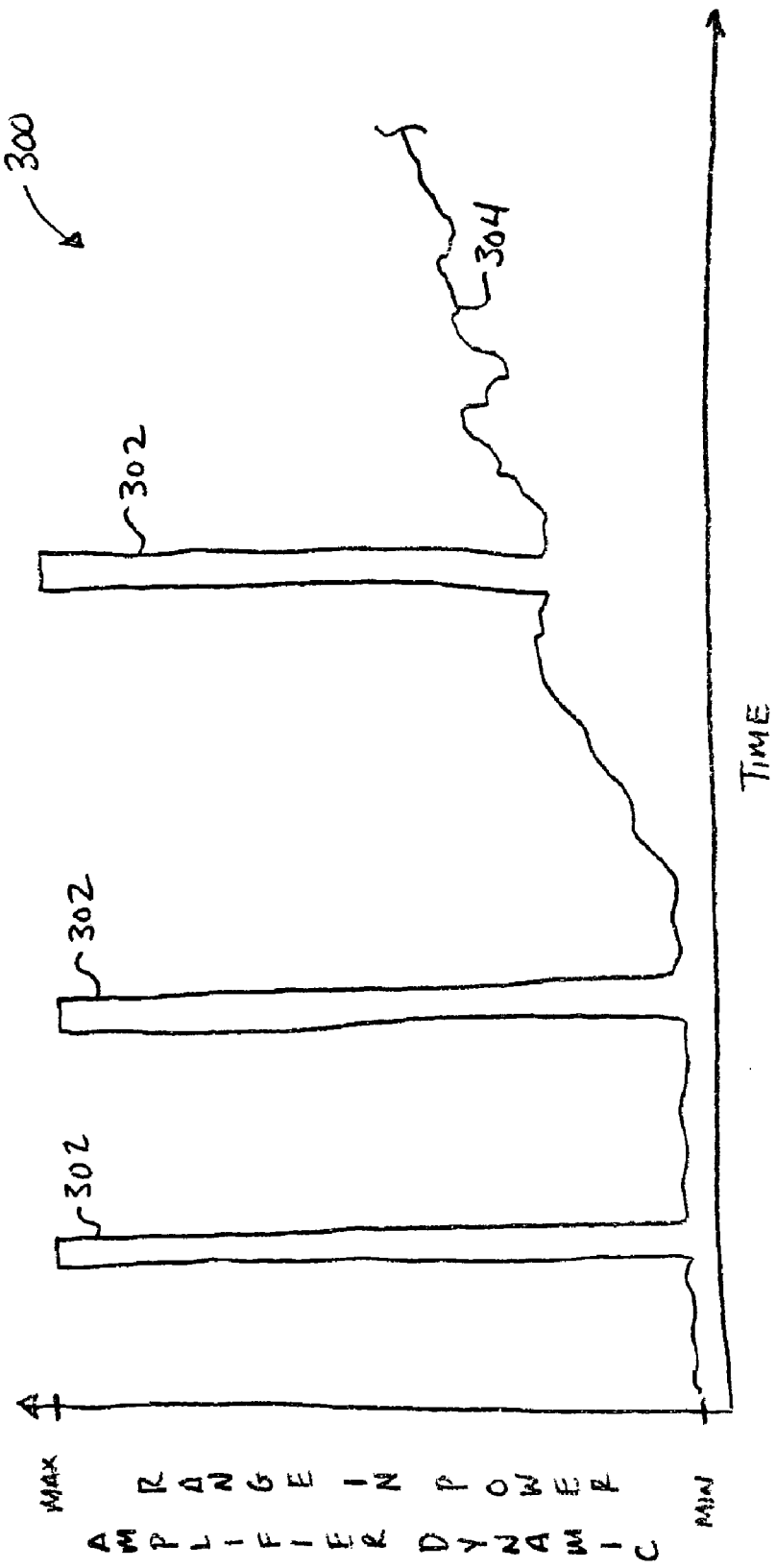
FIG. 3 is a graph illustrating a plurality of pulses, where one pulse added to a traffic signal, in accordance with an exemplary embodiment of the present invention.
Figure 4:
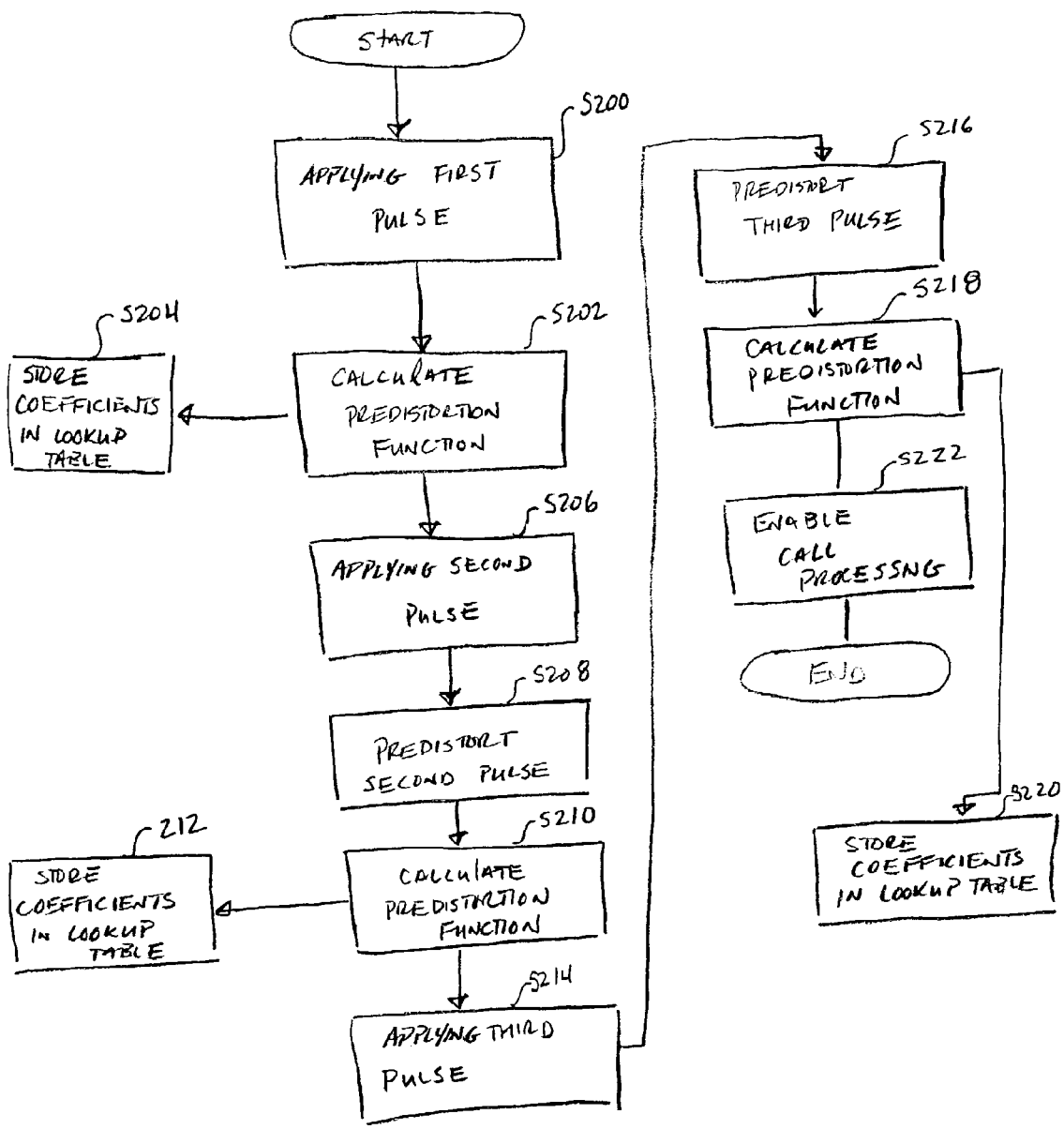
FIG. 4 illustrates a coefficient estimation method in accordance with an exemplary embodiment of the present invention.

FIG. 2 is a graph 200 illustrating a plurality of pulses 302 used to train the transmitter 100 in accordance with an exemplary embodiment of the present invention. FIG. 3 is a graph 300 illustrating a plurality of pulses 302, where one pulse 302 is added to a traffic signal 304, in accordance with an alternative exemplary embodiment of the present invention. The vertical axes of FIGS. 2 and 3 represent the dynamic range of amplifier 116 and the horizontal axes represent time.

As is illustrated in FIG. 2, the plurality of pulses 302 are applied to the transmitter 100 from the pulse generator 102 before the traffic signal 304 is present. Alternatively, FIG. 3 illustrates two pulses 302 that are applied to the transmitter 100 before the traffic signal 304 is present, and one pulse 302 is applied to the transmitter 100 when the traffic signal 304 is already present. In particular, the pulse 302 is applied on top of the traffic signal 302, while taking into consideration the power level of the traffic signal 304 in order to avoid exceeding a maximum dynamic range of the amplifier 116.

Estimation Method Embodiment

A method of estimating coefficients according to an exemplary embodiment of the present invention will be discussed in detail in conjunction with FIG. 2. The coefficient estimating method according to the exemplary embodiment relates to training transmitters employing predistortion systems, before the transmitters are placed in operational service. However, it should be understood that the described coefficient estimating method may also apply to transmitters actively processing traffic signals.

The exemplary embodiment will be discussed in conjunction with the transmitter illustrated in FIG. 1, but this is done by way of illustration only. In particular, the method of estimating coefficients according to an exemplary embodiment of the present invention may be implemented in other arrangements similar to the transmitter illustrated in FIG. 1.

As is illustrated in FIG. 2, a first pulse having a first amplitude is applied to the transmitter 100 (S200). The first pulse (signal) passes through the predistortion unit 110 without undergoing predistortion. This is because the lookup table unit 126 does not currently have predistortion coefficients stored therein.

After the first pulse undergoes processing, as described hereinabove, it is received by the amplifier characteristics estimation unit 122 as the signal y(n). The amplifier characteristics estimation unit 122 calculates a complex polynomial equation and passes the equation to the calculate predistortion function unit 124 (S202). The calculate predistortion function unit 124 provides a coefficient vector of coefficients, based upon the complex polynomial equation, that may be stored in the lookup table 126 (S204). These coefficients may be used directly by the predistortion unit 110 to predistort signals input to the transmitter 100.

Next, a second pulse having a second amplitude is applied to the transmitter 100 (S206). The second pulse (signal) passes through the predistortion unit 110 and is predistorted with coefficients stored in the lookup table 126 (S208). The coefficients used are those calculated as a result of the first pulse.

After the second pulse undergoes processing, as described hereinabove, it is received by the amplifier characteristics estimation unit 122 as the signal y(n). The amplifier characteristics estimation unit 122 calculates a complex polynomial equation and passes the equation to the calculate predistortion function unit 124 (S210). The calculate predistortion function unit 124 provides a coefficient vector of coefficients, based upon the complex polynomial equation, that may be stored in the lookup table 126 (S212). These coefficients may also be used directly by the predistortion unit 110 to predistort signals input to the transmitter 100.

Subsequently, a third pulse having a third amplitude is applied to the transmitter 100 (S214). The third pulse (signal) passes through the predistortion unit 110 and is predistorted with coefficients stored in the lookup table 126 (S216). The coefficients used are those calculated as a result of the second pulse.

After the third pulse undergoes processing, as described hereinabove, it is received by the amplifier characteristics estimation unit 122 as the signal y(n). The amplifier characteristics estimation unit 122 calculates a complex polynomial equation and passes the equation to the calculate predistortion function unit 124 (S218). The calculate predistortion function unit 124 provides a coefficient vector of coefficients, based upon the complex polynomial equation, that may be stored in the lookup table 126 (S220). These coefficients may also be used directly by the predistortion unit 110 to predistort signals input to the transmitter 100.

Finally, after the three pulses are processed by the transmitter 100, the transmitter may be enabled for call processing (S222). That is, call traffic may be processed and effectively predistorted using coefficients stored in the lookup table 126.

Although the processing of the three pulses in accordance with an exemplary embodiment of the present invention provides a set of coefficients that may be used by the transmitter 100 to predistort incoming call traffic, the set of coefficients may be modified and/or supplanted due to any changes that may occur in the operational characteristics of the transmitter 100. In particular, the operational characteristics of the amplifier 116 may change as it ages. For example, the amplifier 116 may be operated at different temperatures and power levels over time. In such a case, coefficients stored in the lookup table 126 may be modified via the amplifier characteristics estimation unit 122 and the calculate predistortion function unit 124, so that a change in a characteristic associated with the amplifier 116 is taken into consideration.

Alternative Embodiments

The exemplary embodiments of the present invention are not limited to the use of only three pulses to train a predistortion arrangement of a transmitter. In particular, a greater number of pulses may be used to provide predistortion coefficients that may offer superior linearity. Similarly, less than three pulses may be used if transmitter linearity is of less importance.

The exemplary embodiments of the present invention are described implementing three pulses having a first, second and third amplitude level, respectively. These amplitude levels may be equal to each other, or may differ. For example, the first amplitude level may be less than the second amplitude level, and the second amplitude level may be less than the third amplitude level. Similarly, the third amplitude level may be less than the second amplitude level, and the second amplitude level may be less than the first amplitude level.

The exemplary embodiments of the present invention being thus described, it will be obvious that the same may be varied in many ways. Such variations are not to be regarded as a departure from the spirit and scope of the exemplary embodiments of the invention, and all such modifications as would be obvious to one skilled in the art are intended to be included within the scope of the following claims.

What is claimed is:

1. A method comprising:
    generating a plurality of training signal bursts with a pulse generation unit; and
    applying the plurality of training signal bursts to an electronic circuit including an amplifier, at least one of the training signal bursts being applied while a predistortion circuit associated with the amplifier is actively processing a traffic signal, each of the plurality of training signal bursts being used to adjust the predistortion circuit the at least one training signal burst having a power level inversely proportional to the traffic signal.

2. A method comprising:
    applying a plurality of training signal bursts to a wireless transmitter including an amplifier, each of the plurality of training signal bursts being used to adjust a predistortion circuit associated with the amplifier, at least one of the training signal bursts being applied while the predistortion circuit is actively processing a traffic signal, the at least one training signal burst having a power level inversely proportional to the traffic signal.

3. The method according to claim 2, wherein at least one other training signal burst is applied before the wireless transmitter is used to process traffic signals.

4. A method comprising:
applying a plurality of training signal bursts to an electronic circuit including an amplifier, at least one of the training signal bursts being applied while a predistortion circuit associated with the amplifier is actively processing a traffic signal,
the at least one training signal burst having a power level inversely proportional to the traffic signal,
the at least one training signal burst substantially exciting a full dynamic range of the amplifier, and
each of the plurality of training signal bursts being used to adjust the predistortion circuit.

5. The method of claim 4,
wherein each training signal burst substantially excites a full dynamic range of the amplifier.

6. A method, comprising:
applying a first training signal burst to an electronic circuit;
calculating a first set of coefficients based upon the first training signal burst;
applying a second training signal burst to the electronic circuit;
predistorting the second training signal burst using the first set of coefficients; and
calculating a second set of coefficients based upon the predistorted second training signal burst;
applying a traffic signal to the electronic circuit;
adding a third training signal burst to the traffic signal;
predistorting the combined traffic signal and third training pulse signal with the second set of coefficients; and
calculating a third set of coefficients based upon the predistorted combined traffic signal and the third training signal burst.

7. The method according to claim 6, further comprising:
applying a third training signal burst;
predistorting the third training signal burst using the second set of coefficients;
calculating a third set of coefficients based upon the predistorted third training signal burst; and
enabling traffic signal flow.

8. The method according to claim 6, further comprising:
adding additional pulses to traffic signals for use in calculating additional sets of coefficients.

9. A method comprising:
generating at least one training signal burst with a pulse generation unit; and
applying the at least one training signal burst to an electronic circuit including an amplifier, while a predistortion circuit associated with the amplifier is actively processing a traffic signal, to adjust the predistortion circuit, the at least one training signal burst having a power level inversely proportional to the traffic signal.

* * * * *